United States Patent [19]

Kishi et al.

[11] 4,149,155
[45] Apr. 10, 1979

[54] APPARATUS FOR DISPLAYING PLANT DATA

[75] Inventors: Shoichi Kishi, Sagamihara; Takaharu Fukuzaki, Koganei; Yukio Nagaoka, Sagamihara, all of Japan

[73] Assignee: Hitachi, Ltd., Japan

[21] Appl. No.: 785,850

[22] Filed: Apr. 8, 1977

[30] Foreign Application Priority Data

Apr. 9, 1976 [JP] Japan .................................. 51-39355

[51] Int. Cl.$^2$ ............................................ G08B 29/00
[52] U.S. Cl. ................................. 340/524; 340/52 F; 340/188 R; 340/500
[58] Field of Search .......... 340/52 F, 173 CC, 188 R, 340/213 R, 213 Q, 225, 324 M, 324 A, 324 AD, 366 CA, 366 A, 366 D, 366 F, 378 R, 378 A, 409

[56] References Cited

U.S. PATENT DOCUMENTS

| 3,558,865 | 1/1971 | Berndt | 340/324 |
| 3,871,579 | 3/1975 | Inamura | 340/324 A |

Primary Examiner—Alvin H. Waring
Attorney, Agent, or Firm—Craig & Antonelli

[57] ABSTRACT

A standard picture such as a circle, of which the magnitude can be varied in response to the present value of a main plant data signal (or significant data), is displayed in a picture-plane of a display means. The present values of a large amount of plant data being monitored is displayed along the above-mentioned standard picture. When all of the plant data represents the normal state to the present value of the significant data, a picture constructed by plotting spots which indicates the plant data in a picture plane of display means, may be identified with the standard picture. Thus, the present value of the significant data can be determined by the magnitude of the standard picture, and whether the plant state is normal or abnormal can be determined by the picture constructed by plotting the spots of the plant data.

9 Claims, 3 Drawing Figures

4,149,155

APPARATUS FOR DISPLAYING PLANT DATA

BACKGROUND OF THE INVENTION

This invention relates to an apparatus for displaying plant data such as that provided on a control panel of a power plant.

In every kind of heat power plant, nuclear power plant and the like, in order to monitor the plant state, the plant data is displayed on a data indicator such as an indicator, a recorder and the like, which has been provided on the control panel. In this case, the conventional data indicator is generally the sole data indicator on which a single type of plant data can be indicated. Thus, when discriminating with a large amount of different types of plant data whether the total plant state is normal or abnormal, a disadvantage is having to watch many data indicators, which is very inconvenient.

In order to solve such a problem, a data display apparatus has been previously suggested by the same inventor as that of the present invention, in which plant data value is represented the deviation length from the center of a picture plane of a display means, kind of the plant data being represented with the position on a picture displayed, and the picture being displayed when all plant data are normal as a circle (Japanese Patent Application No. 133416/1973.

In this data display apparatus, it is easily possible to determine whether the plant state is normal or abnormal, since the magnitude of the circle picture is constant. However, another disadvantage is that the absolute value of the plant data cannot be determined thereby.

SUMMARY OF THE INVENTION

It is an object of the present invention to provide an apparatus for displaying plant data, in which the conventional disadvantages have been solved, and, in more detail, in which it is possible intuitively to know whether the plant state is normal or abnormal and also to determine the absolute value of significant data of the plant.

In order to accomplish the above-mentioned object, in the present invention, a standard picture like a circle, of which the magnitude can be varied responsive to the present value of a main plant data signal (or significant data), is displayed in a picture plane of a display means, and also present values of many plant data to watch is displayed along with the standard picture, in such a manner than when all of the plant data represents the normal state to the present value of the significant data, a picure constructed by plotting spots which indicates the plant data in a picture plane of display means, may be identified to the standard picture. Thus, the present value of the significant data can be determined by the magnitude of the standard picture, and, by the picture constructed by plotting the spots of the plant data, it is easily possible to discriminate whether the plant state is normal or abnormal.

DESCRIPTION OF THE PREFERRED EMBODIMENTS

The present invention will be hereinafter explained in detail in reference to the embodiments.

Figure 1:
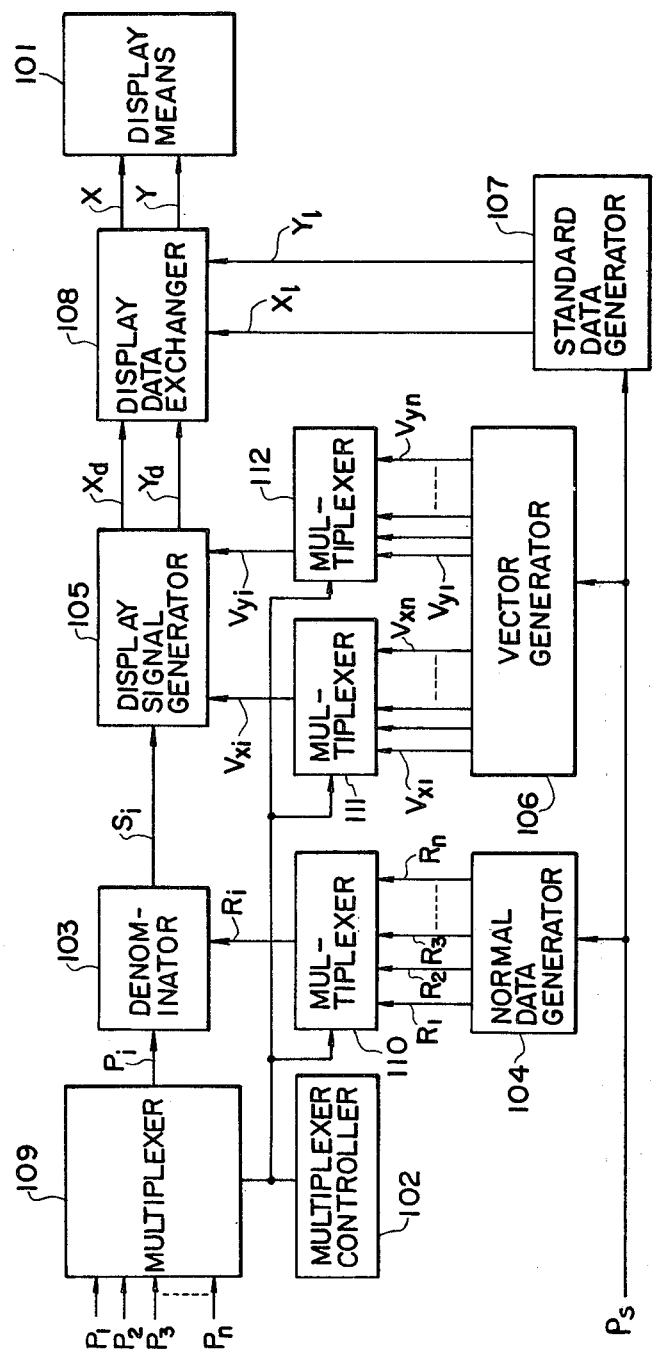
FIG. 1 is a block diagram illustrating an embodiment of the present invention.

FIG. 1 is a block diagram illustrating an embodiment of the present invention. In the drawing, the reference number 101 denotes display means, 102 a multiplexer controller, 103 a denominator, 104 a normal data generator, 105 a display signal generator, 106 a vector generator, 107 a standard data generator, 108 a display data exchanger and 109 to 112 multiplexers, respectively.

Figure 2:
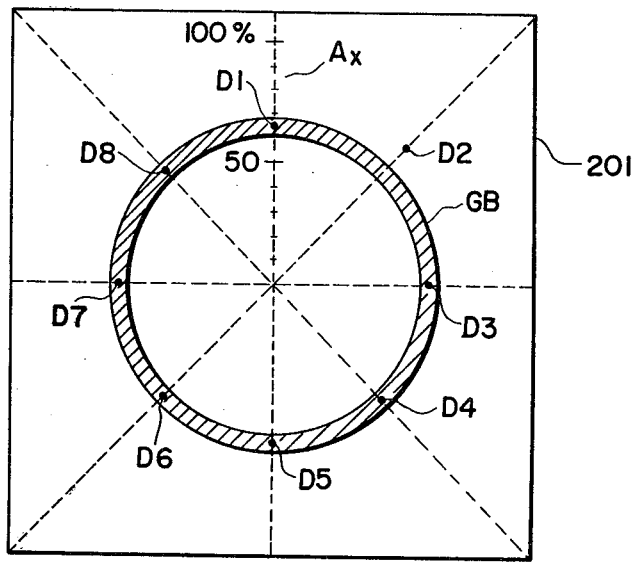
FIG. 2 is a illustration view showing an example of the display in the present invention.

FIG. 2 is an illustration view showing an example of the display, in which an oscillator is used as the display means 101, and all plant data is represented in a form of polar coordinates, such that a circle picture may be constructed by plotting spots, for example, eight spots as indicate the plant data in the oscillator. In the drawing, the reference number 201 denotes a picture plane of the oscilloscope as the display means 101, D1 to D8 denote spots which indicate present values of the plant data, respectively, and GB denotes a standard picture of which the magnitude corresponds to the present value of the significant data. In this embodiment, the standard picture GB is displayed in a form of a circle with certain width, that is to say, a ring, of which the width indicates a normal range of the plant data.

In this case, when all plant data indicated are in a normal region, a circular picture similar to the standard picture GB is constructed by plotting the spots D1 to D8. This state can be very definitely seen by the standard picture GB. That is to say, this means that when the spots exists on the ring as constructs the standard picture GB, the plant data is normal, and when the spot does not exist on the ring, that is, when the spot exists out of or within the ring, the plant data is abnormal. In FIG. 2, the spot D2 exists out of the standard picture GB, and thus it indicates that this plant data is abnormal.

The magnitude of the standard picture GB, for example, the radius thereof in this embodiment (in more detail, average radius of the external and internal circles of the ring as the standard picture GB), means the significant data of a plant, for example, in a nuclear power plant, the present value of a reactor power. The magnitude in the standard picture GB varies as the value of the significant data varies. And then, when the plant data represents a normal value to the present value of the significant data, the spots D1 to D8 of the plant data can always exist on the standard picture GB. That is to say, in the present invention, whether the plant is normal or abnormal can be seen by the shape of the picture, for example, the ring in the present embodiment, which is constructed with the spots of many plant data. And the present value of the significant data can be seen by the magnitude of the standard picture, for example, the ring. In FIG. 2, the mark Ax denotes scale, which has been previously drawn on the picture plane of the oscilloscope in order to read the magnitude of the standard picture GB, that is, the present value of the significant data, which denotes the absolute value or the percentage to the rated value.

The operating of the embodiment shown in FIG. 1 will be hereinafter explained in reference to an example of the picture plane in FIG. 2. In FIG. 1, the marks $P_1$ to $P_n$ denote the plant data to be displayed. $P_S$ denotes the main plant data signal (or the significant data), for example, that of the reactor power in the nuclear power plant, but it does not matter even if $P_S$ is included within the plant data $P_1$ to $P_n$.

The multiplexer 109 selects the plant data $P_1$ to $P_n$ in order by a selection signal derived from the multiplexer controller 102, and sends the selected plant data to the denominator 103. The normal data generator 104 generates normal value signals $R_1$ to $R_n$ of the plant data $P_1$ to $P_n$ in response to the present value of the significant value $P_S$.

In this case, as an example, in power-up mode of the nuclear power plant, the significant data $P_S$ can apply the reactor power. The plant data to be watched can apply reactor water level, reactor pressure, feed water flow, main stream flow, generator power and so on. When the plant is normally operated, the feed water flow, the main stream flow and the generator power are proportional to the reactor power, and the reactor water level and the reactor pressure are constantly maintained in the power-up mode in spite of the reactor power. Thus, each normal value of the plant data can be predetermined as a function of the significant data $P_S$ and the normal data generator 104 can be constructed by function generator, operation device and so on.

The normal value signals $R_1$ to $R_n$ of the plant data are the input to the multiplexer 110 and are in order sent in response to a selection signal derived from the multiplexer controller 102, as well as in case of the multiplexer 109.

The denominator 103 normalizes the plant data Pi with the normal value signal Ri. That is, the denominator 103 processes the operation as follows;

$$Si = \frac{Pi}{Ri}$$

and sends the normalized signal Si to the display signal generator 105, wherein the above-mentioned operation can be processed with at least one divider.

The vector generator 106 generates a position vector of the spot in cases the plant data is normal. The position of the spot which indicates that the plant data is normal varies with the value of the significant data $P_S$. That is, in the example as shown in FIG. 2, X and Y components of the positions of the spots corresponding to the normal values are given as a function of the significant data $P_S$ in the following, and thus the vector generator 106 can be easily constructed with the combination of operational amplifier:

D1: $V_{x1} = 0$, $V_{y1} = P'_S$
D2: $V_{x2} = \frac{1}{\sqrt{2}} P'_S$, $V_{y2} = \frac{1}{\sqrt{2}} P'_S$
D3: $V_{x3} = P'_S$, $V_{y3} = 0$
D4: $V_{x4} = \frac{1}{\sqrt{2}} P'_S$, $V_{y4} = -\frac{1}{\sqrt{2}} P'_S$
D5: $V_{x5} = 0$, $V_{y5} = -P'_S$
D6: $V_{x6} = -\frac{1}{\sqrt{2}} P'_S$, $V_{y6} = -\frac{1}{\sqrt{2}} P'_S$
D7: $V_{x7} = -P'_S$, $V_{y7} = 0$
D8: $V_{x8} = -\frac{1}{\sqrt{2}} P'_S$, $V_{y8} = \frac{1}{\sqrt{2}} P'_S$ wherein $P_S'$ denotes value which has normalized the present value of $P_S$ with the rated value.

Thus, the X-component, $V_{x1}$ to $V_{xn}$, and Y-component, $V_{y1}$ to $V_{yn}$, of the position vectors which represent the spot positions of the normal values of the plant data corresponding to $P_S'$, are input to the multiplexer 111 and 112, and are sent to the display signal generator 105 in order.

In the above-mentioned embodiment, the picture which is constructed by plotting the spots is circular, but as is needless to say that the present invention is not limited to the circular picture. That is, in the case of the picture except the circle, as the above-mentioned function and constant are changed, the vector generator 106 can be performed by changing the combination of the operational amplifier. The display signal generator 105 processes the operation as follows:

$$X_{di} = V_{xi} \cdot Si \cdot \alpha$$

$$Y_{di} = V_{yi} \cdot Si \cdot \alpha$$

wherein the mark i denotes the suffix of the data, $P_1$ to $P_n$, $R_1$ to $R_n$, $V_{x1}$ to $V_{xn}$ and $V_{y1}$ to $V_{yn}$, selected by the multiplexers 108 to 112, which are successively repeated from, 1 to n at every constant time by the selection signals, and $\alpha$ denotes the coefficient to convert an input signal supplied into the display means 101 into a voltage value as an example. And then the display signal generator 105 generates the display signal $X_d$, $Y_d$ by which the spots that have normalized the present values of the plant data with the respective normal values are displayed in the display means 101. The above-mentioned operation can be performed by using multiplier.

The standard data generator 107 determines the radius of the standard picture GB with the value of the significant data $P_S$, and generates standard data signals $X_l$, $Y_l$ to display the standard picture GB in the display means 101.

The display signals $X_d$, $Y_d$ and the standard data signals $X_l$, $Y_l$ are alternately sent to the display means 101 at every constant time determined by the display data exchanger 108. Accordingly, in the picture plane 201 of the display means 101, as shown in FIG. 2, the standard picture GB and the spots $D_1$ to $D_8$ of the plant data are displayed.

In the embodiment of FIG. 1, the multiplexer controller 102, the denominator 103, the normal data generator 104, the display signal generator and the vector generator 106 are separatedly provided, but these means can be also processed in a computer.

Figure 3:
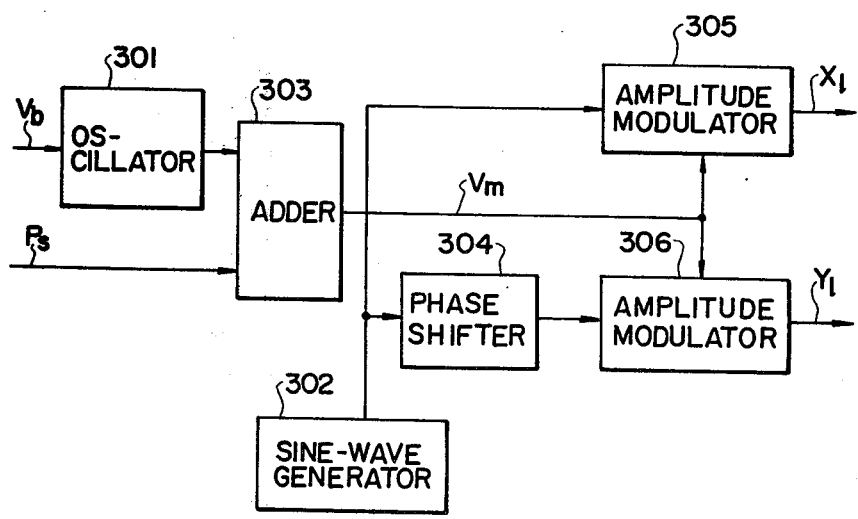
FIG. 3 is a block diagram illustrating an example of the standard data generator.

FIG. 3 shows an example of the standard data generator 107 to display the circular picture with a width, that is, the ring picture, as shown in FIG. 2. In the drawing, the reference number 301 denotes an oscillator, 302 a sine-wave generator, 303 an adder, 304 a phase shifter, and 305 and 306 denote amplitude modulators.

The sine-wave signal derived from the sine-wave generator 303 is divided into two parts, one part of which is directly input to the amplitude modulator 305, and the other part of which lags or leads its phase by 90° with the phase shifter 304, and further is input to the amplitude modulator 306. In this case, when the modulation signal Vm derived from the adder 303 is constant, the output signals of the amplitude modulators 305,306 are sine-waves with constant amplitude, of which the phases deviate by 90° each other. When these two signals are input to the display means 101 such as an oscilloscope, a circular picture is drawn as a Lissajous' figure therein.

The modulation signal Vm to display a circular picture with a width, such as that in FIG. 2, can be generated as discussed hereafter. The, signal Vb which determines the width of the picture is impressed to the oscillator 301. The signal Vb can either be a predetermined voltage determined by a potentiometer or the like, or can be a voltage which has appropriately varied responsive to the value of the significant data $P_S$.

The oscillator 301 generates a repeated signal which has the value of Vb as its amplitude. The wave form of the repeated signal is not limited to a sine-wave, and a saw-tooth wave, a triangular wave or other wave forms can be also applied thereto.

The adder 303 outputs the modulation signal Vm which has added the value of the significant data $P_S$ to the repeated signal. That is, the modulation signal Vm is the repeated signal which varies between the value $$P_S - \frac{Vb}{2}$$

and the value $$P_S + \frac{Vb}{2}.$$

By modulating the sine-wave with such the repeated signal and impressing it to the display means 101, the Lissajous' figure drawn in the picture plane of the display means displays a circle of which the radius varies within of a certain region repeatedly and successively, that is, a ring picture. Then, when the frequencies of the sine-wave and the repeated signal are appropriately selected, for example, when the frequency of the sine-wave makes several ten times as many of that of the repeated signal, a circular picture withe a certain width, that is, a ring picture as drawn with an oblique line in FIG. 2, can be displayed on the picture plane of the display means 101.

Also, when a rectangular wave is selected as the wave form of the oscillator 301, the standard picture represents two concentric circles, which correspond to the internal and external circles of the standard picture shown in FIG. 2. In this case, the internal and external circles can be used as the pictures representative of the lower limit and upper limit values, respectively.

Further, in the case where the standard picture except a circular shape is desired to be displayed, the construction of the standard data generator as shown in FIG. 3 is changed a little. For example, when the output signal of the adder 303 is directly used as the standard data signals $X_l$ or $Y_l$, the standard picture represents a straight line picture of which the distance to the base line on the picture plane, for example, to the X-axis or Y-axis in FIG. 2, is $X_l$ or $Y_l$. In this case, the value of the significant data $P_S$ is represented with the distance between the base line and the standard picture, that is, the linear picture.

In the example shown in FIG. 2, the significant data $P_S$ is indicated over the whole region, but it is also possible to indicate it with several divided ranges such as the range of 0 to 50% and 50 to 100%. This can be accomplished by adding to the input part of the vector generator 106 an operation processing function such as, for example, where the range can be changed over with a half value of the rated value, $$P_{SO} = P_S \times 2 \ (P_S \leq \frac{P_f}{2})$$
$$P_{SO} = (P_S - \frac{P_f}{2}) \times 2 \ (P_S > \frac{P_f}{2})$$

wherein the value $P_f$ denotes the rated value of the significant data $P_S$. Thus, the value $P_{SO}$ obtained by the above-mentioned formula can be applied as the input signal of the vector generator 106 and the standard data generator 107.

As stated above, in the present invention, the standard picture such as a circle, of which the magnitude can be varied in response to the present value of the significant data $P_S$, is displayed in the picture plane of the display means 101 along with the present values of many plant data being monitored in such a manner that when all of the plant data represents the normal value to the present value of the significant data, a picture constructed by plotting the spots indicating the plant data in the picture plane of the display means, may be similar to the standard picture. When and abnormal value in the plant data has occurred, the picture constructed by the plant data may be distorted since the display position of the abnormal plant data in the picture plane is not on the standard picture GB.

Thus, the present value of the significant data $P_S$ can be easily determined by the magnitude of the standard picture, and further whether the operation state of the plant is normal or abnormal can be intuitively known by the picture constructed with the plant data.

Furthermore, when the standard picture is displayed as the picture with a predetermined width and the present values of the plant data exist within of the above-mentioned width, the plant data can be determined to be normal, whereby it can be very easily known whether the operation state of the plant is normal or abnormal. Thus, the present invention has a marked effect as an apparatus for displaying plant data.

We claim:

1. An apparatus for displaying plant data comprising:

first means, responsive to the present value of a main plant data signal, for providing a normal value signal for each of a plurality of plant data signals, which normal value signal corresponds to the present value of the main plant data signal;

second means, responsive to said first means, for normalizing the plant data signals with the normal value signal derived from said first means;

third means for generating position vector signals which determine the position at which the normal value signals is indicated in a picture plane of a display means, in response to the present value signal of the main plant data signal;

fourth means for generating data display signals which determine the position at which the present value signal of each of the plant data signals is indicated in the picture plane of said display means, in response to the normalized value signal derived from the second means and the position vector signals from the third means; and fifth means for generating a standard picture of which the magnitude is determined corresponding to that of the present value signal of the main plant data signal, said display means displaying both the data display signals derived from the fourth means and the standard picture.

2. An apparatus for displaying plant data as claimed in claim 1, wherein said display means is provided in such a manner that when the plant data, respectively, represent the normal values, in response to the present value of the main plant data signal, a picture constructed by plotting spots which indicate the present values of the plant data in the picture plane of said display means, may be similar to the standard picture.

3. An apparatus for displaying plant data as claimed in claim 1, wherein said second means comprises at least two one divider.

4. An apparatus for displaying plant data as claimed in claim 1, wherein said third means comprises at least one operational amplifier.

5. An apparatus for displaying plant data as claimed in claim 1, wherein said fourth means comprises at least one multiplier.

6. An apparatus for displaying plant data as claimed in claim 1, wherein said standard picture is constructed by a closed line having a predetermined width to form a ring, of which the width represents a region of the normal values of the plant data to the main plant data signal.

7. An apparatus for displaying plant data as claimed in claim 6, wherein said fifth means comprises a first oscillator for generating repeated signal having amplitude by which the width of the standard picture is determined, an adder for adding the main plant data signal to the repeated signal derived from said first oscillator, a sine-wave generator for generating sine-wave signal, which is sent to a first amplitude modulator and also to a second amplitude modulator through a phase shifter, said phase shifter for shifting the sine-wave signal derived from said sine-wave generator by the phase of 90°, said first amplitude modulator responsive to the signals derived from said sine-wave generator and said adder for sending a signal representative of the standard picture to said display means, and said second amplitude modulator, responsive to the signals derived from said phase shifter and said adder, for sending another signal representative of the standard picture to said display means.

8. An apparatus for displaying plant data as claimed in claim 1, wherein said standard picture represents two concentric circles, of which external and internal circles represent upper limit and lower limit values of the normal values of the plant data, respectively.

9. An apparatus for displaying plant data as claimed in claim 1, wherein said standard picture represents a straight line, in which the value of the main plant data signal is indicated by the distance between said standard picture and a base line previously drawn on the picture plane of said display means.

* * * * *